US012628698B2

(12) United States Patent
Lu et al.

(10) Patent No.:  US 12,628,698 B2
(45) Date of Patent:       May 12, 2026

(54) MULTI-LAYER ELECTRONIC DEVICE INTERCONNECTION METHOD AND STRUCTURE

(71) Applicant: Taiwan Semiconductor Manufacturing Company, Ltd., Hsinchu (TW)

(72) Inventors: Yu-Lun Lu, Hsinchu City (TW); Kong-Beng Thei, Pao-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 18/163,410

(22) Filed: Feb. 2, 2023

(65) Prior Publication Data

US 2024/0088096 A1      Mar. 14, 2024

Related U.S. Application Data

(60) Provisional application No. 63/405,978, filed on Sep. 13, 2022.

(51) Int. Cl.
H01L 25/065      (2023.01)
H01L 21/768      (2006.01)
(Continued)

(52) U.S. Cl.
CPC ...... H01L 25/0657 (2013.01); H01L 23/5226 (2013.01); H01L 24/08 (2013.01); (Continued)

(58) Field of Classification Search
CPC ....... H01L 25/0657; H01L 2224/08145; H01L 25/50; H01L 24/08; H01L 24/80; H01L 23/5226; H01L 21/76898; H01L 2224/80895; H01L 2224/80896; H01L 21/4857; H01L 23/481; H01L 24/03; H01L 24/06; H01L 2224/02372; H01L 2224/80001; H01L 24/09; H01L 2224/05548; H01L 2224/13022; (Continued)

(56) References Cited

U.S. PATENT DOCUMENTS

2001/0016369 A1      8/2001  Zandman et al.
2013/0319737 A1      12/2013  Hurwitz
(Continued)

FOREIGN PATENT DOCUMENTS

TW           499746 B       8/2002
TW        202008526 A       2/2020

*Primary Examiner* — Sonya McCall-Shepard
(74) *Attorney, Agent, or Firm* — Eschweiler & Potashnik, LLC

(57) ABSTRACT

An electronic device and a method for manufacturing the same are provided. The electronic device includes an upper electronic structure, an upper connection structure, a first metal layer, a lower electronic structure, a lower connection structure and a second metal layer. The first metal layer electrically connects the upper electronic structure to the upper connection structure. The second metal layer electrically connects the lower electronic structure to the lower connection structure. The upper connection structure and the lower connection structure are bonded together.

20 Claims, 16 Drawing Sheets

(51) Int. Cl.
    *H01L 23/00*       (2006.01)
    *H01L 23/522*     (2006.01)
    *H01L 25/00*      (2006.01)

(52) U.S. Cl.
    CPC .... *H01L 24/80* (2013.01); *H01L 2224/08145*
        (2013.01); *H01L 2224/80895* (2013.01); *H01L*
               *2224/80896* (2013.01)

(58) Field of Classification Search
    CPC . H01L 2224/13024; H01L 2225/06541; H01L
        2224/06517; H01L 2224/09517; H10D
                          88/00
    See application file for complete search history.

(56)                 References Cited

U.S. PATENT DOCUMENTS

| | | | |
|---|---|---|---|
| 2020/0035672 A1* | 1/2020 | Thei | H01L 24/03 |
| 2020/0043832 A1 | 2/2020 | Mohamed et al. | |
| 2021/0391302 A1* | 12/2021 | Kao | H01L 23/53228 |
| 2022/0278095 A1 | 9/2022 | Kao | |

\* cited by examiner

MULTI-LAYER ELECTRONIC DEVICE INTERCONNECTION METHOD AND STRUCTURE

CROSS-REFERENCE TO RELATED APPLICATIONS

This application claims the benefit of U.S. Provisional Application No. 63/405,978, filed Sep. 13, 2022, the contents of which are hereby incorporated by reference in their entirety.

BACKGROUND

As for electronic devices such as multi-stacked devices using wafer-on-wafer (WoW) bonding, face-to-face interconnection can be required for more efficient circuit design and lower resistance, thanks to shorter interconnections. When the circuit design needs to be changed, the original metal line layout becomes an issue. It is difficult to change other metal connections for newly designed circuits through the face-to-face interconnection. If the multi-stacked device is used for function contacts, arranging a reticle field layout (RFL) is also tricky.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
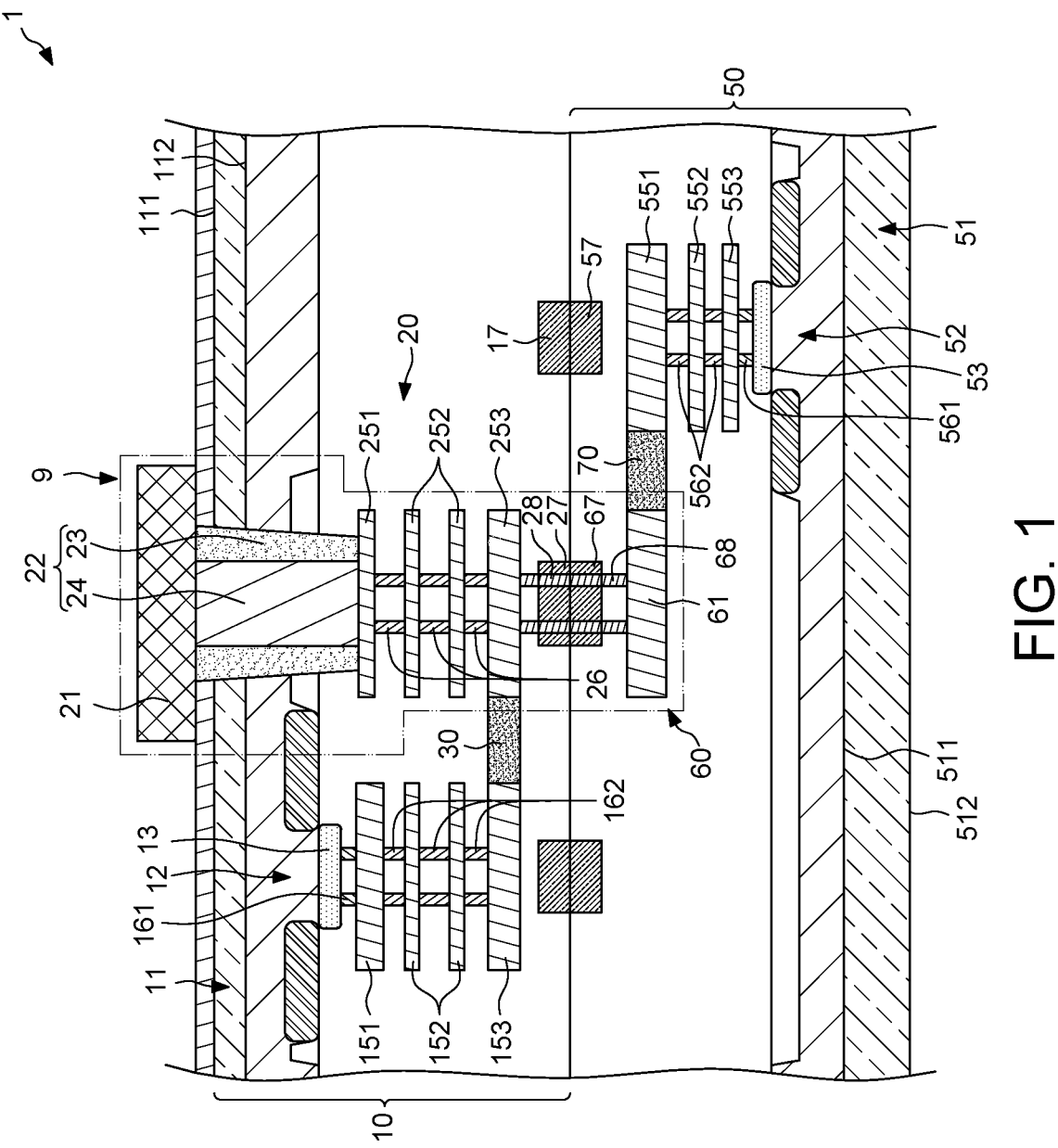
FIG. 1 illustrates a cross-sectional view of an electronic device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a cross-sectional view of an electronic device 1 according to some embodiments of the present disclosure. The electronic device 1 includes an upper electronic structure 10, an upper connection structure 20, a first metal layer 30, a lower electronic structure 50, a lower connection structure 60 and a second metal layer 70. In some embodiments, the electronic device 1 can be, for example, multi-stacked device.

The upper electronic structure 10 can be, for example, a low-voltage electronic structure. In some embodiments, the upper electronic structure 10 can also be referred to as "top wafer," "top die" or "top device." In some embodiments, the upper electronic structure 10 can include a substrate 11, a well structure 12, at least one terminal 13, a plurality of circuit layers (including, for example, topmost circuit layer 151, inter-circuit layer 152 and bottommost circuit layer 153), a plurality of inner vias (including, for example, inner vias 161 and inner vias 162) and at least one bond layer 17.

The substrate 11 can be, for example, p-substrate. Thus, the substrate 11 can also be referred to as "Psub." The substrate 11 has a top surface 111 and a bottom surface 112 opposite to the top surface 111.

The well structure 12 is disposed on the bottom surface 112 of the substrate 11. The well structure 12 can be, for example, low-voltage p-well. Thus, the well structure 12 can also be referred to as "LVPW."

The at least one terminal 13 contacts the well structure 12 (e.g., a bottom surface). The at least one terminal 13 can be, for example, gate terminal.

The plurality of circuit layers (e.g., the topmost circuit layer 151, the inter-circuit layer 152 and the bottommost circuit layer 153) are disposed below the at least one terminal 13 and longitudinally spaced apart from each other. In some embodiments, as shown in FIG. 1, a thickness of the topmost circuit layer 151 and a thickness of the bottommost circuit layer 153 can be greater than a thickness of the inter-circuit layer 152. In some embodiments, the plurality of circuit layers (e.g., the topmost circuit layer 151, the inter-circuit layer 152 and the bottommost circuit layer 153) can also be referred to as "metal layers (e.g., the topmost metal layer 151, the inter-metal layer 152 and the bottommost metal layer 153)." In some embodiments, the topmost circuit layer 151 can be also referred to as metal one (M1).

The plurality of inner vias (e.g., the inner vias 161 and the inner vias 162) are configured for electrical interconnection. For example, some of the plurality of inner vias (e.g., the inner vias 161) can be disposed between the at least one terminal 13 and the topmost circuit layer 151 for electrically connecting the at least one terminal 13 and the topmost circuit layer 151. Some of the plurality of inner vias (e.g., the inner vias 162) can be disposed between the plurality of circuit layers (e.g., the topmost circuit layer 151, the inter-circuit layer 152 and the bottommost circuit layer 153) for electrically connecting the plurality of circuit layers (e.g., the topmost circuit layer 151, the inter-circuit layer 152 and the bottommost circuit layer 153).

The at least one bond layer 17 is disposed below the bottommost circuit layer 153 for hybrid bonding. Hybrid bonding is a technology for forming a bonding interface with a metal-to-metal bonding region and a dielectric-to-dielectric bonding region. In some embodiments, the at least one bond layer 17 can be spaced apart from the bottommost circuit layer 153.

The upper connection structure 20 is configured for external connection of the upper electronic structure 10. In some embodiments, the upper connection structure 20 can include at least one circuit layer, a redistribution layer 21, a via structure 22, a plurality of inner vias 26, at least one bond layer 27 and a plurality of contacts 28. In some embodiments, the at least one circuit layer can include a plurality of circuit layers (including, for example, topmost circuit layer 251, inter-circuit layer 252 and bottommost circuit layer 253).

The plurality of circuit layers (e.g., the topmost circuit layer 251, the inter-circuit layer 252 and the bottommost circuit layer 253) are disposed below the well structure 12 of the upper electronic structure 10 and longitudinally spaced apart from each other. In some embodiments, as shown in FIG. 1, a thickness of the bottommost circuit layer 253 can be greater than a thickness of the topmost circuit layer 251 and a thickness of the inter-circuit layer 252. In some embodiments, the thickness of the bottommost circuit layer 253 of the upper connection structure 20 can be the same as the thickness of the bottommost circuit layer 153 of the upper electronic structure 10. The thickness of the inter-circuit layer 252 of the upper connection structure 20 can be the same as the thickness of the inter-circuit layer 152 of the upper electronic structure 10. In some embodiments, the plurality of circuit layers (e.g., the topmost circuit layer 251, the inter-circuit layer 252 and the bottommost circuit layer 253) can also be referred to as "metal layers (e.g., the topmost metal layer 251, the inter-metal layer 252 and the bottommost metal layer 253)."

The redistribution layer 21 is disposed over the substrate 11 of the upper electronic structure 10. In some embodiments, a material of the redistribution layer 21 can include metal such as copper or aluminum. The via structure 22 can be disposed between the redistribution layer 21 and the topmost circuit layer 251 for electrically connecting the redistribution layer 21 and the topmost circuit layer 251. In some embodiments, the via structure 22 can include a through silicon via 23 and a redistribution via 24. The through silicon via 23 can extend through the substrate 11 and the well structure 12 of the upper electronic structure 10. In some embodiments, the through silicon via 23 can contact the topmost circuit layer 251. In some embodiments, a material of the through silicon via 23 can include oxide. The redistribution via 24 can extend through the through silicon via 23 and contact the redistribution layer 21 and the topmost circuit layer 251. In some embodiments, a bottom surface of the redistribution via 24 can be substantially coplanar with a top surface of the topmost circuit layer 251 and a bottom surface of the through silicon via 23. In some embodiments, a material of the redistribution via 24 can include metal such as copper.

The plurality of inner vias 26 are disposed between the plurality of circuit layers (e.g., the topmost circuit layer 251, the inter-circuit layer 252 and the bottommost circuit layer 253) for electrically connecting the plurality of circuit layers (e.g., the topmost circuit layer 251, the inter-circuit layer 252 and the bottommost circuit layer 253).

The at least one bond layer 27 is disposed below the bottommost circuit layer 253 for hybrid bonding. In some embodiments, the at least one bond layer 27 can be spaced apart from the bottommost circuit layer 253. In some embodiments, an elevation of the at least one bond layer 27 of the upper connection structure 20 can be the same as an elevation of the at least one bond layer 17 of the upper electronic structure 10. A material of the at least one bond layer 27 can include glue. In some embodiments, the at least one bond layer 27 of the upper connection structure 20 and the at least one bond layer 17 of the upper electronic structure 10 can be formed concurrently.

The plurality of contacts 28 can extend through the at least one bond layer 27 and contact the bottommost circuit layer 253.

Figure 2A:
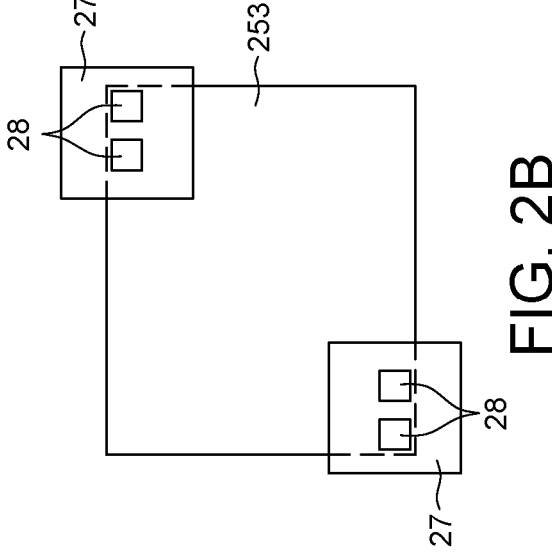
FIGS. 2A-2D illustrate bottom views of various configurations of contacts and a bottommost circuit layer of the upper connection structure according to some embodiments of the present disclosure.
Figure 2B:
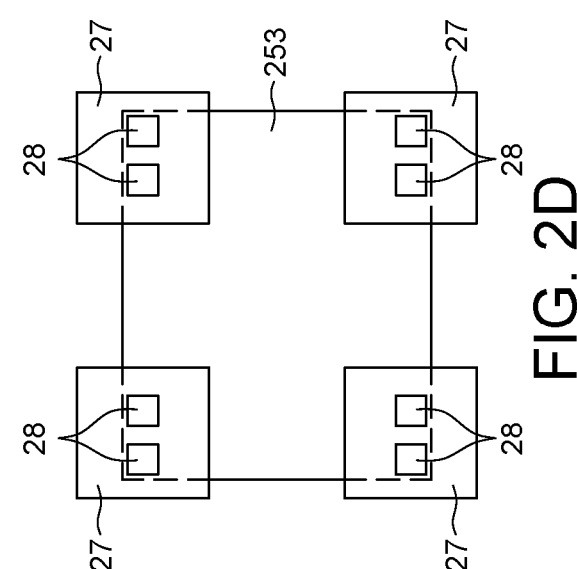
Figure 2C:
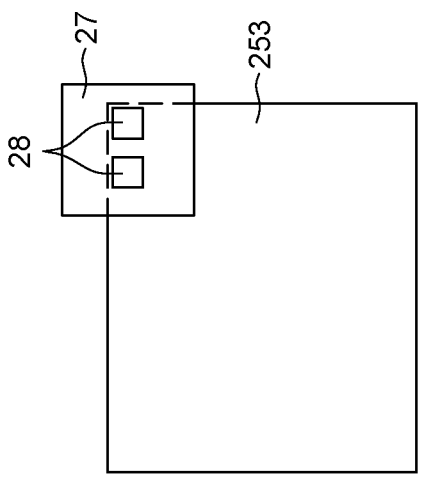
Figure 2D:
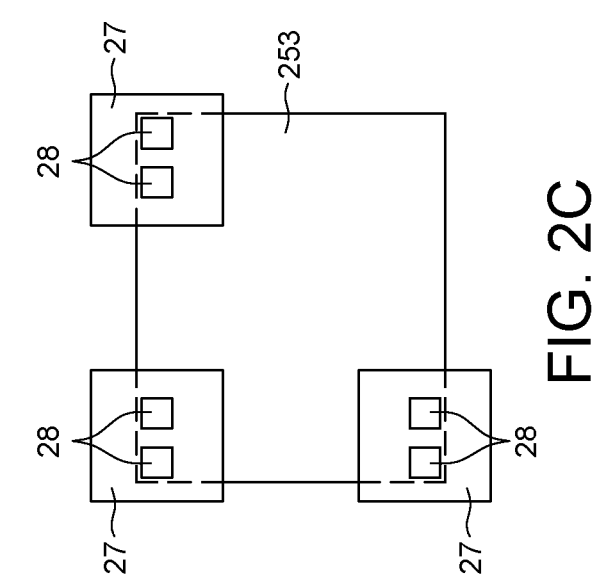

FIGS. 2A-2D illustrate bottom views of various configurations of contacts 28 and a bottommost circuit layer 253 according to some embodiments of the present disclosure. In some embodiments, as shown in FIGS. 2A-2D, the plurality of contacts 28 can be arranged on one corner of the bottommost circuit layer 253 (FIG. 2A), two corners of the bottommost circuit layer 253 (FIG. 2B), three corners of the bottommost circuit layer 253 (FIG. 2C), or four corners of the bottommost circuit layer 253 (FIG. 2D). In some embodiments, the plurality of contacts 28 can be arranged on at least two corners of the bottommost circuit layer 253 to prevent open circuits between the plurality of contacts 28 and the bottommost circuit layer 253 due to improper manufacturing process. That is, the arrangements of the contacts 28 shown in FIGS. 2A-2D can ensure the electrical connection between the contacts 28 and the bottommost circuit layer 253.

As shown in FIG. 1, the first metal layer 30 electrically connects the upper electronic structure 10 to the upper connection structure 20. Thus, the first metal layer 30 can be an electrical path between the upper electronic structure 10 and the upper connection structure 20. In some embodiments, the first metal layer 30 can electrically connect the bottommost circuit layer 153 of the upper electronic structure 10 to the bottommost circuit layer 253 of the upper connection structure 20. Thus, the first metal layer 30 can be an electrical path between the bottommost circuit layer 153 of the upper electronic structure 10 and the bottommost circuit layer 253 of the upper connection structure 20. In some embodiments, as shown in FIG. 1, a thickness of the first metal layer 30 can be the same as the thickness of the bottommost circuit layer 253 of the upper connection structure 20 and the thickness of the bottommost circuit layer 153 of the upper electronic structure 10. In some embodiments, the thickness of the first metal layer 30 can be greater than the thickness of the inter-circuit layer 152 of the upper electronic structure 10 and the thickness of the inter-circuit layer 252 of the upper connection structure 20. In some embodiments, the first metal layer 30, the bottommost circuit layer 253 of the upper connection structure 20 and the bottommost circuit layer 153 of the upper electronic structure 10 can be formed concurrently. In some embodiments, the first metal layer 30 and the bottommost circuit layer 253 of the upper connection structure 20 can be formed at different times or different stages. The first metal layer 30 and the bottommost circuit layer 153 of the upper electronic structure 10 can be formed at different times or different stages. In some embodiments, an elevation of the first metal layer 30 can be the same as an elevation of the bottommost circuit layer 253 of the upper connection structure 20 and an elevation of the bottommost circuit layer 153 of the upper electronic structure 10. In some embodiments, a material of the first metal layer 30 can be the same as a material of the bottommost circuit layer 253 of the upper connection structure 20 and a material of the bottommost circuit layer 153 of the upper electronic structure 10.

The lower electronic structure 50 can be, for example, a medium-voltage or high-voltage electronic structure. In some embodiments, the lower electronic structure 50 can also be referred to as "bottom wafer," "bottom die" or "bottom device." In some embodiments, the lower electronic structure 50 can include a substrate 51, a well structure 52, at least one terminal 53, a plurality of circuit layers (including, for example, topmost circuit layer 551, inter-circuit layer 552 and bottommost circuit layer 553), a plurality of inner vias (including, for example, inner vias 561 and inner vias 562) and at least one bond layer 57.

The substrate 51 can be, for example, p-substrate. Thus, the substrate 51 can also be referred to as "Psub." The substrate 51 has a top surface 511 and a bottom surface 512 opposite to the top surface 511.

The well structure 52 is disposed on the top surface 511 of the substrate 51. The well structure 52 can be, for example, high-voltage p-well. Thus, the well structure 52 can also be referred to as "HVPW."

The at least one terminal 53 contacts the well structure 52 (e.g., a top surface). The at least one terminal 53 can be, for example, gate terminal.

The plurality of circuit layers (e.g., the topmost circuit layer 551, the inter-circuit layer 552 and the bottommost circuit layer 553) are disposed over the at least one terminal 53 and longitudinally spaced apart from each other. In some embodiments, as shown in FIG. 1, a thickness of the topmost circuit layer 551 can be greater than a thickness of the inter-circuit layer 552 and a thickness of the bottommost circuit layer 553. In some embodiments, the plurality of circuit layers (e.g., the topmost circuit layer 551, the inter-circuit layer 552 and the bottommost circuit layer 553) can also be referred to as "metal layers (e.g., the topmost metal layer 551, the inter-metal layer 552 and the bottommost metal layer 553)." In some embodiments, the bottommost metal layer 553 can be also referred to as metal one (M1).

The plurality of inner vias (e.g., the inner vias 561 and the inner vias 562) are configured for electrical interconnection. For example, some of the plurality of inner vias (e.g., the inner vias 561) can be disposed between the at least one terminal 53 and the bottommost circuit layer 553 for electrically connecting the at least one terminal 53 and the bottommost circuit layer 553. Some of the plurality of inner vias (e.g., the inner vias 562) can be disposed between the plurality of circuit layers (e.g., the topmost circuit layer 551, the inter-circuit layer 552 and the bottommost circuit layer 553) for electrically connecting the plurality of circuit layers (e.g., the topmost circuit layer 551, the inter-circuit layer 552 and the bottommost circuit layer 553).

The at least one bond layer 57 is disposed over the topmost circuit layer 551 for hybrid bonding to the at least one bond layer 17 of the upper electronic structure 10. In some embodiments, the at least one bond layer 57 can be spaced apart from the topmost circuit layer 551. A material of the at least one bond layer 57 can include glue.

The lower connection structure 60 is configured for external connection of the lower electronic structure 50. As shown in FIG. 1, the lower connection structure 60 and the upper connection structure 20 can be bonded together. In some embodiments, the lower connection structure 60 and the upper connection structure 20 can constitute at least one shared connection structure 9. Thus, the lower connection structure 60 can also be referred to as "lower connection portion 60," and the upper connection structure 20 can also be referred to as "upper connection portion 20." In some embodiments, the at least one shared connection structure 9 can also be referred to as "shared connection kickboard."

In some embodiments, the lower connection structure 60 can include at least one circuit layer 61, at least one bond layer 67 and a plurality of contacts 68. The at least one circuit layer 61 is disposed over the well structure 52 of the lower electronic structure 50. In some embodiments, as shown in FIG. 1, a thickness of the at least one circuit layer 61 can be the same as the thickness of the topmost circuit layer 551 of the lower electronic structure 50. The thickness of the at least one circuit layer 61 can be greater than the thickness of the inter-circuit layer 552 of the lower electronic structure 50 and the thickness of the bottommost circuit layer 553 of the lower electronic structure 50. In some embodiments, the at least one circuit layer 61 can also be referred to as "metal layer."

The at least one bond layer 67 is disposed over the at least one circuit layer 61 for hybrid bonding to the at least one bond layer 27 of the upper connection structure 20. In some embodiments, the at least one bond layer 67 can be spaced apart from the at least one circuit layer 61. In some embodiments, an elevation of the at least one bond layer 67 of the lower connection structure 60 can be the same as an elevation of the at least one bond layer 57 of the lower electronic structure 50. In some embodiments, the at least one bond layer 67 of the lower connection structure 60 and the at least one bond layer 57 of the lower electronic structure 50 can be formed concurrently.

The plurality of contacts 68 can extend through the at least one bond layer 67 and contact the at least one circuit layer 61. In some embodiments, configurations of the plurality of contacts 68 and the at least one circuit layer 61 can be the same as the configurations of the plurality of contacts 28 and the bottommost circuit layer 253 of FIGS. 2A-2D respectively. The contacts 68 of the lower connection structure 60 are electrically connected to the contacts 28 of the upper connection structure 20.

As shown in FIG. 1, the second metal layer 70 electrically connects the lower electronic structure 50 to the lower connection structure 60. Thus, the second metal layer 70 can be an electrical path between the lower electronic structure 50 and the lower connection structure 60. In some embodiments, the second metal layer 70 can electrically connect the topmost circuit layer 551 of the lower electronic structure 50 to the at least one circuit layer 61 of the lower connection structure 60. Thus, the second metal layer 70 can be an electrical path between the topmost circuit layer 551 of the lower electronic structure 50 and the at least one circuit layer 61 of the lower connection structure 60. In some embodiments, as shown in FIG. 1, a thickness of the second metal layer 70 can be the same as the thickness of the at least one circuit layer 61 of the lower connection structure 60 and the thickness of the topmost circuit layer 551 of the lower electronic structure 50. In some embodiments, the thickness of the second metal layer 70 can be greater than the thickness of the inter-circuit layer 552 of the lower electronic structure 50 and the thickness of the bottommost circuit layer 553 of the lower electronic structure 50. In some embodiments, the second metal layer 70, the at least one circuit layer 61 of the lower connection structure 60 and the topmost circuit layer 551 of the lower electronic structure 50 can be formed concurrently. In some embodiments, the second metal layer 70 and the at least one circuit layer 61 of the lower connection structure 60 can be formed at different times or different stages. The second metal layer 70 and the topmost circuit layer 551 of the lower electronic structure 50 can be formed at different times or different stages. In some embodiments, an elevation of the second metal layer 70 can be the same as an elevation of the at least one circuit layer 61 of the lower connection structure 60 and an elevation of the topmost circuit layer 551 of the lower electronic structure 50. In some embodiments, a material of the second metal layer 70 can be the same as a material of the at least one circuit layer 61 of the lower connection structure 60 and a material of the topmost circuit layer 551 of the lower electronic structure 50.

As shown in the embodiment illustrated in FIG. 1, the upper electronic structure 10 can be electrically connected or bonded to the lower electronic structure 50 through the upper connection structure 20. Accordingly, the lower electronic structure 50 can be electrically connected or bonded to the upper electronic structure 10 through the lower connection structure 60. Thus, face-to-face interconnection between the bottommost circuit layer 153 (or the at least one terminal 13) of the upper electronic structure 10 and the topmost circuit layer 551 (or the at least one terminal 53) of the lower electronic structure 50 is not required, reducing design changes' difficulties. That is, the location of the bottommost circuit layer 153 (or the at least one terminal 13) of the upper electronic structure 10 is not needed to align with the location of the topmost circuit layer 551 (or the at least one terminal 53) of the lower electronic structure 50. The designs of the location of the bottommost circuit layer 153 (or the at least one terminal 13) of the upper electronic structure 10 and the location of the topmost circuit layer 551 (or the at least one terminal 53) of the lower electronic structure 50 are flexible. If the electronic device 1 is used for function contacts, arranging the reticle field layout (RFL) becomes easier.

Figure 3:
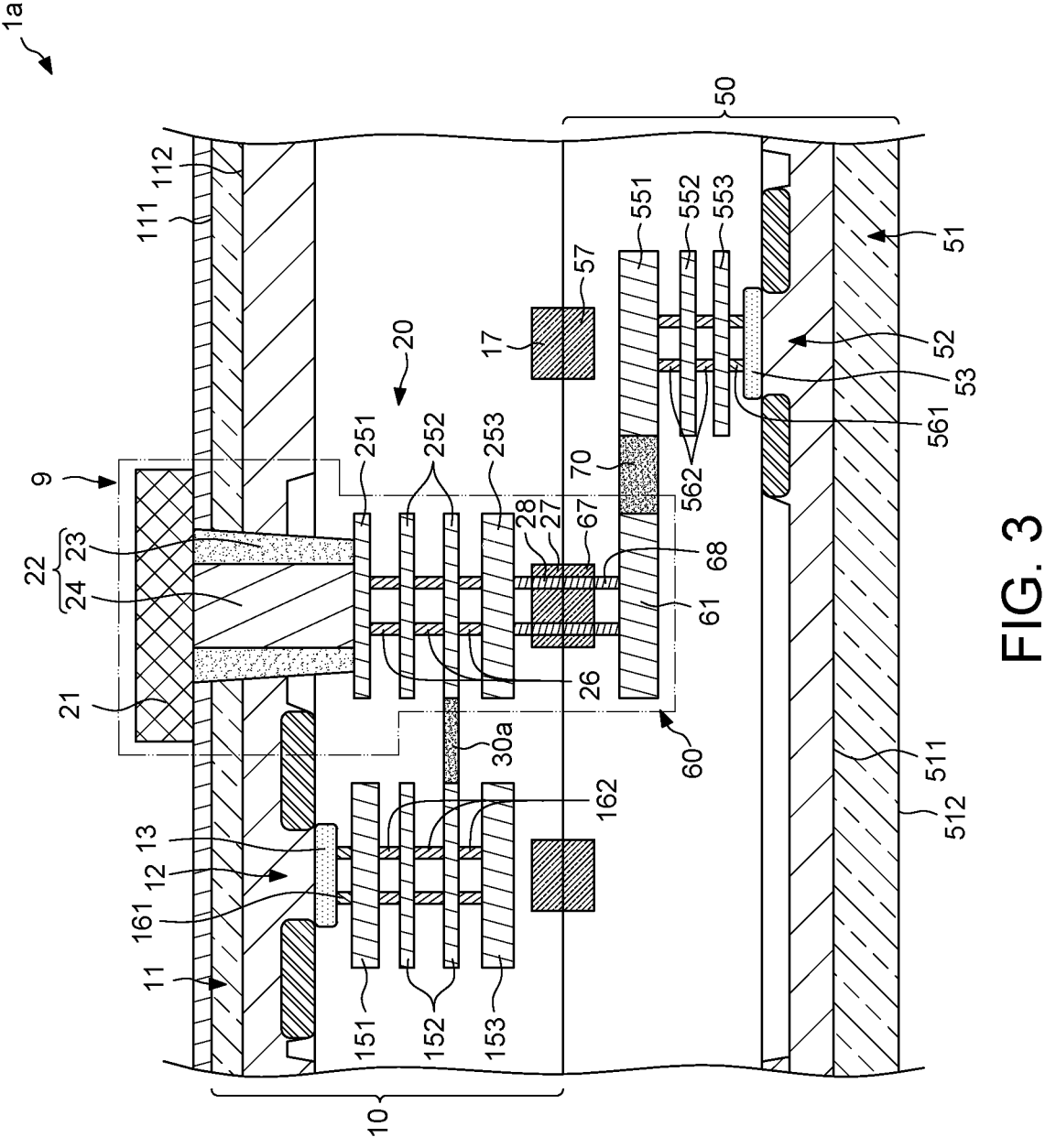
FIG. 3 illustrates a cross-sectional view of an electronic device according to some embodiments of the present disclosure.

FIG. 3 illustrates a cross-sectional view of an electronic device 1a according to some embodiments of the present disclosure. The electronic device 1a of FIG. 3 is similar to the electronic device 1 of FIG. 1, except for a configuration of the first metal layer 30a. In some embodiments, as shown in FIG. 3, the first metal layer 30a can electrically connect the inter-circuit layer 152 of the upper electronic structure 10 to the inter-circuit layer 252 of the upper connection structure 20. In some embodiments, a thickness of the first metal layer 30a can be the same as the thickness of the inter-circuit layer 252 of the upper connection structure 20 and the thickness of the inter-circuit layer 152 of the upper electronic structure 10. In some embodiments, the thickness of the first metal layer 30a can be less than the thickness of the bottommost circuit layer 153 of the upper electronic structure 10 and the thickness of the bottommost circuit layer 253 of the upper connection structure 20. In some embodiments, the first metal layer 30a, the inter-circuit layer 252 of the upper connection structure 20 and the inter-circuit layer 152 of the upper electronic structure 10 can be formed concurrently. In some embodiments, an elevation of the first metal layer 30a can be the same as an elevation of the inter-circuit layer 252 of the upper connection structure 20 and an elevation of the inter-circuit layer 152 of the upper electronic structure 10. In some embodiments, a material of the first metal layer 30a can be the same as a material of the inter-circuit layer 252 of the upper connection structure 20 and a material of the inter-circuit layer 152 of the upper electronic structure 10.

Figure 4:
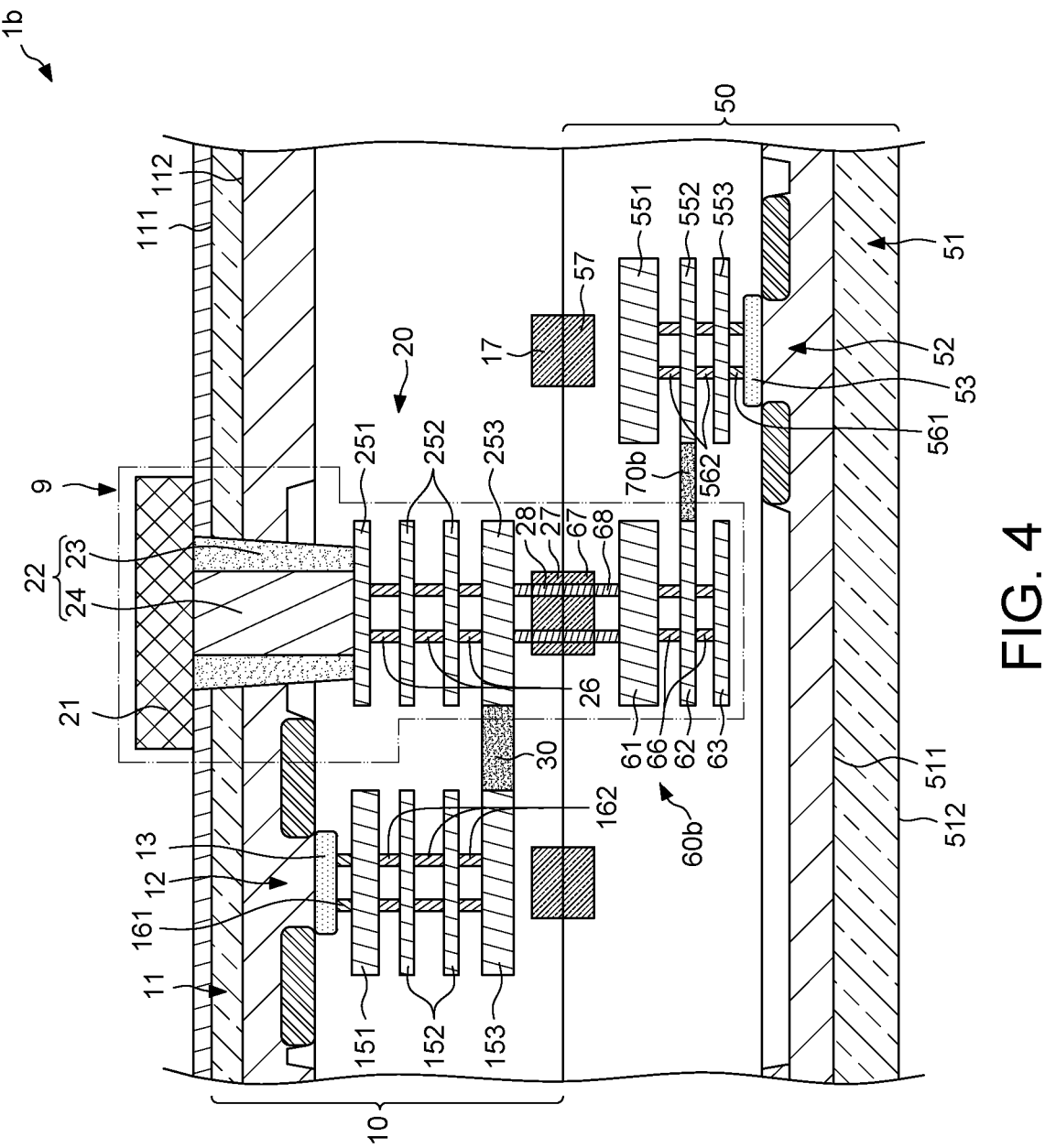
FIG. 4 illustrates a cross-sectional view of an electronic device according to some embodiments of the present disclosure.

FIG. 4 illustrates a cross-sectional view of an electronic device 1b according to some embodiments of the present disclosure. The electronic device 1b of FIG. 4 is similar to the electronic device 1 of FIG. 1, except for a structure of the lower connection structure 60b and a configuration of the second metal layer 70b. In some embodiments, as shown in FIG. 4, the lower connection structure 60b can further include an inter-circuit layer 62, a bottommost circuit layer 63 and a plurality of inner vias 66. The at least one circuit layer 61 can also be referred to as "topmost circuit layer 61." The topmost circuit layer 61, the inter-circuit layer 62 and the bottommost circuit layer 63 are longitudinally spaced apart from each other. In some embodiments, as shown in FIG. 4, a thickness of the topmost circuit layer 61 can be greater than a thickness of the inter-circuit layer 62 and a thickness of the bottommost circuit layer 63. The thickness of the inter-circuit layer 62 of the lower connection structure 60b can be the same as the thickness of the inter-circuit layer 552 of the lower electronic structure 50. The thickness of the bottommost circuit layer 63 of the lower connection structure 60b can be the same as the thickness of the bottommost circuit layer 553 of the lower electronic structure 50. In some embodiments, the topmost circuit layer 61, the inter-circuit layer 62 and the bottommost circuit layer 63 can also be referred to as "the topmost metal layer 61, the inter-metal layer 62 and the bottommost metal layer 63."

In some embodiments, as shown in FIG. 4, the second metal layer 70b can electrically connect the inter-circuit layer 552 of the lower electronic structure 50 to the inter-circuit layer 62 of the lower connection structure 60b. In some embodiments, a thickness of the second metal layer 70b can be the same as the thickness of the inter-circuit layer 62 of the lower connection structure 60b and the thickness of the inter-circuit layer 552 of the lower electronic structure 50. In some embodiments, the thickness of the second metal layer 70b can be less than the thickness of the topmost circuit layer 61 of the lower connection structure 60b and the thickness of the topmost circuit layer 551 of the lower electronic structure 50. In some embodiments, the second metal layer 70b, the inter-circuit layer 62 of the lower connection structure 60b and the inter-circuit layer 552 of the lower electronic structure 50 can be formed concurrently. In some embodiments, an elevation of the second metal layer 70b can be the same as an elevation of the inter-circuit layer 62 of the lower connection structure 60b and an elevation of the inter-circuit layer 552 of the lower electronic structure 50. In some embodiments, a material of the second metal layer 70b can be the same as a material of the inter-circuit layer 62 of the lower connection structure 60b and a material of the inter-circuit layer 552 of the lower electronic structure 50.

Figure 5:
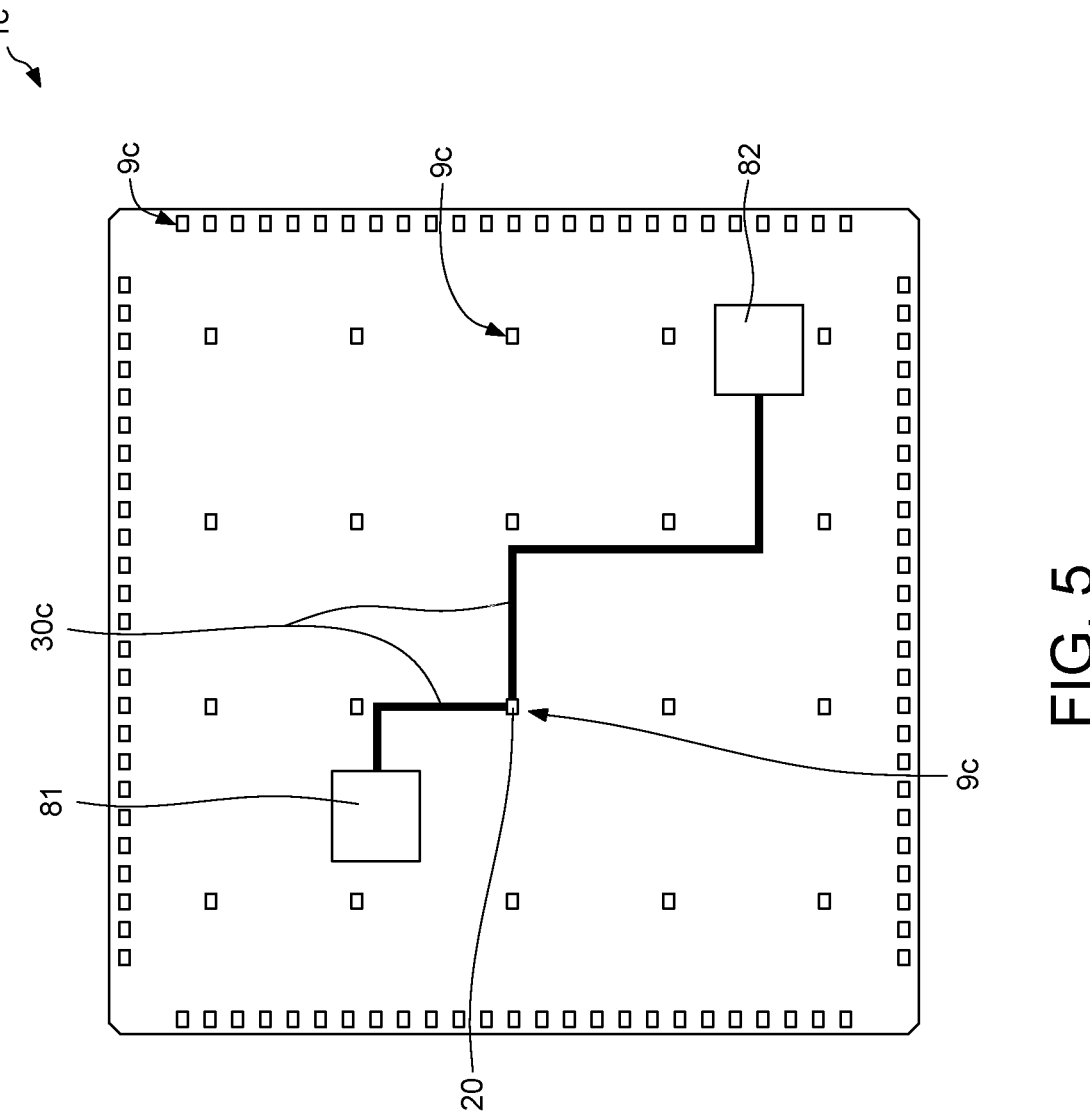
FIG. 5 illustrates a schematic layout of an upper portion of an electronic device according to some embodiments of the present disclosure.
Figure 6:
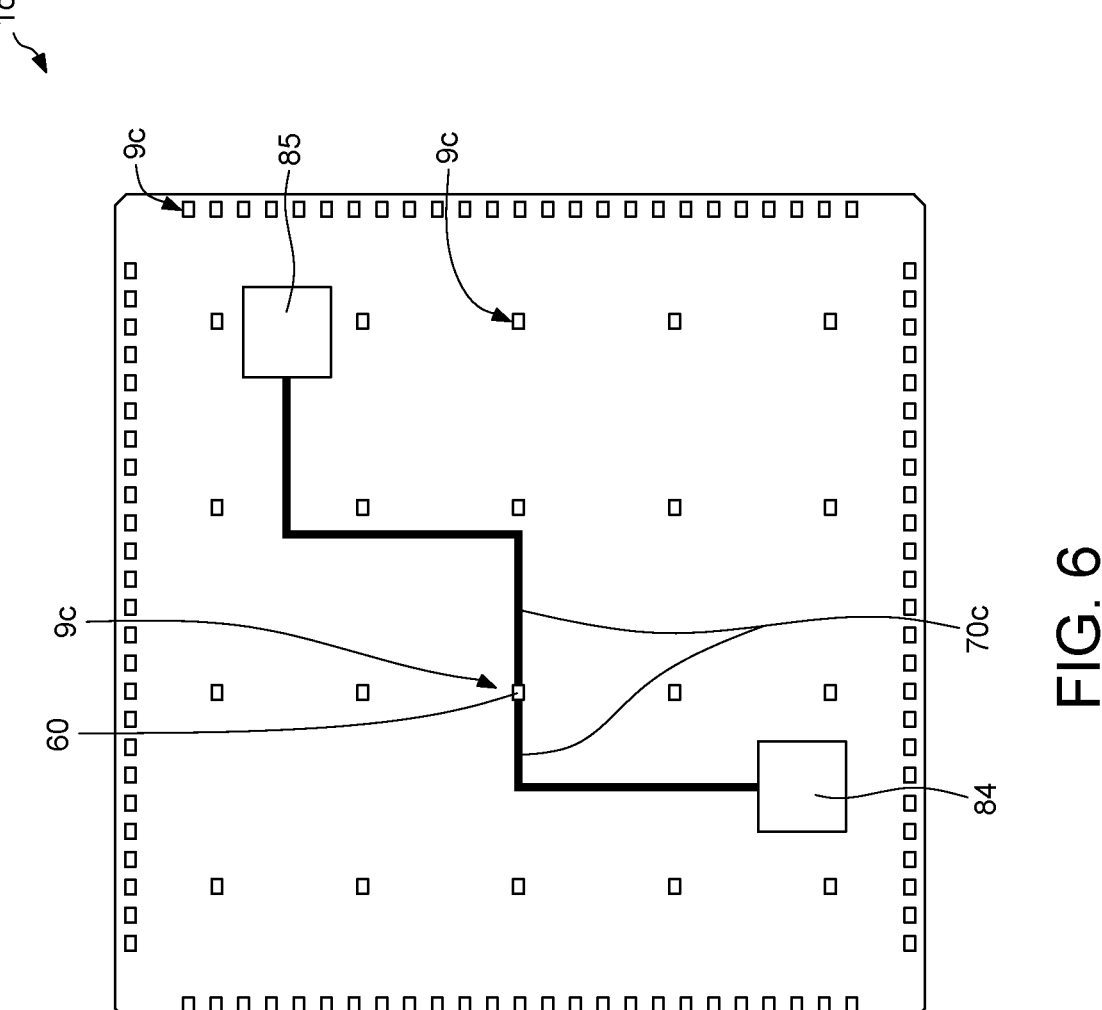
FIG. 6 illustrates a schematic layout of a lower portion of an electronic device of FIG. 5.

FIG. 5 illustrates a schematic layout of an upper portion of an electronic device 1c according to some embodiments of the present disclosure. FIG. 6 illustrates a schematic layout of a lower portion of an electronic device of FIG. 5. The electronic device 1c includes at least one shared connection structure 9c, at least one upper electronic structure (including, for example, upper electronic structure 81 and upper electronic structure 82), a first metal layer 30c, at least one lower electronic structure (including, for example, lower electronic structure 84 and lower electronic structure 85) and a second metal layer 70c. The at least one shared connection structure 9c of FIG. 5 and FIG. 6 can be the same as the at least one shared connection structure 9 of FIG. 1. Thus, the at least one shared connection structure 9c of FIG. 5 and FIG. 6 can include the upper connection portion 20 of FIG. 1 and the lower connection portion 60 of FIG. 1. In some embodiments, as shown in FIG. 5 and FIG. 6, the at least one shared connection structure 9c can include a plurality of shared connection structures 9c.

The at least one upper electronic structure (e.g., the upper electronic structure 81 and the upper electronic structure 82) is electrically connected to the upper connection portion 20 of the at least one shared connection structure 9c through the first metal layer 30c. In some embodiments, the upper electronic structure 81 can be, for example, static random access memory (SRAM) device. The upper electronic structure 82 can be, for example, diode.

The at least one lower electronic structure (e.g., the lower electronic structure 84 and the lower electronic structure 85) is electrically connected to the lower connection portion 60 of the at least one shared connection structure 9c through the second metal layer 70c. In some embodiments, the lower electronic structure 84 can be, for example, medium-voltage device. The lower electronic structure 85 can be, for example, bipolar junction transistor (BJT) device. In some embodiments, as shown in FIG. 5 and FIG. 6, the at least one lower electronic structure (e.g., the lower electronic structure 84) can be misaligned with the at least one upper electronic structure (e.g., the upper electronic structure 81). A sum of an amount of the at least one upper electronic structure (e.g., the upper electronic structure 81 and the upper electronic structure 82) and an amount of the at least one lower electronic structure (e.g., the lower electronic structure 84 and the lower electronic structure 85) can be greater than 2, such as greater than or equal to 3.

As shown in the embodiment illustrated in FIG. 5 and FIG. 6, the at least one upper electronic structure (e.g., the upper electronic structure 81 and the upper electronic structure 82) and the at least one lower electronic structure (e.g., the lower electronic structure 84 and the lower electronic structure 85) can be electrically connected to the same shared connection structure 9c, thus saving the design area. In addition, the layout of the electronic device 1c can be accomplished as follows. Firstly, the locations of the shared connection structures 9c are fixed. Then, the locations of the at least one upper electronic structure (e.g., the upper electronic structure 81 and the upper electronic structure 82) and the at least one lower electronic structure (e.g., the lower electronic structure 84 and the lower electronic structure 85) can be determined according to requirement. Then, at least one suitable shared connection structure 9c is selected. Then, the first metal layer 30c and the second metal layer 70c are determined.

Figure 7:
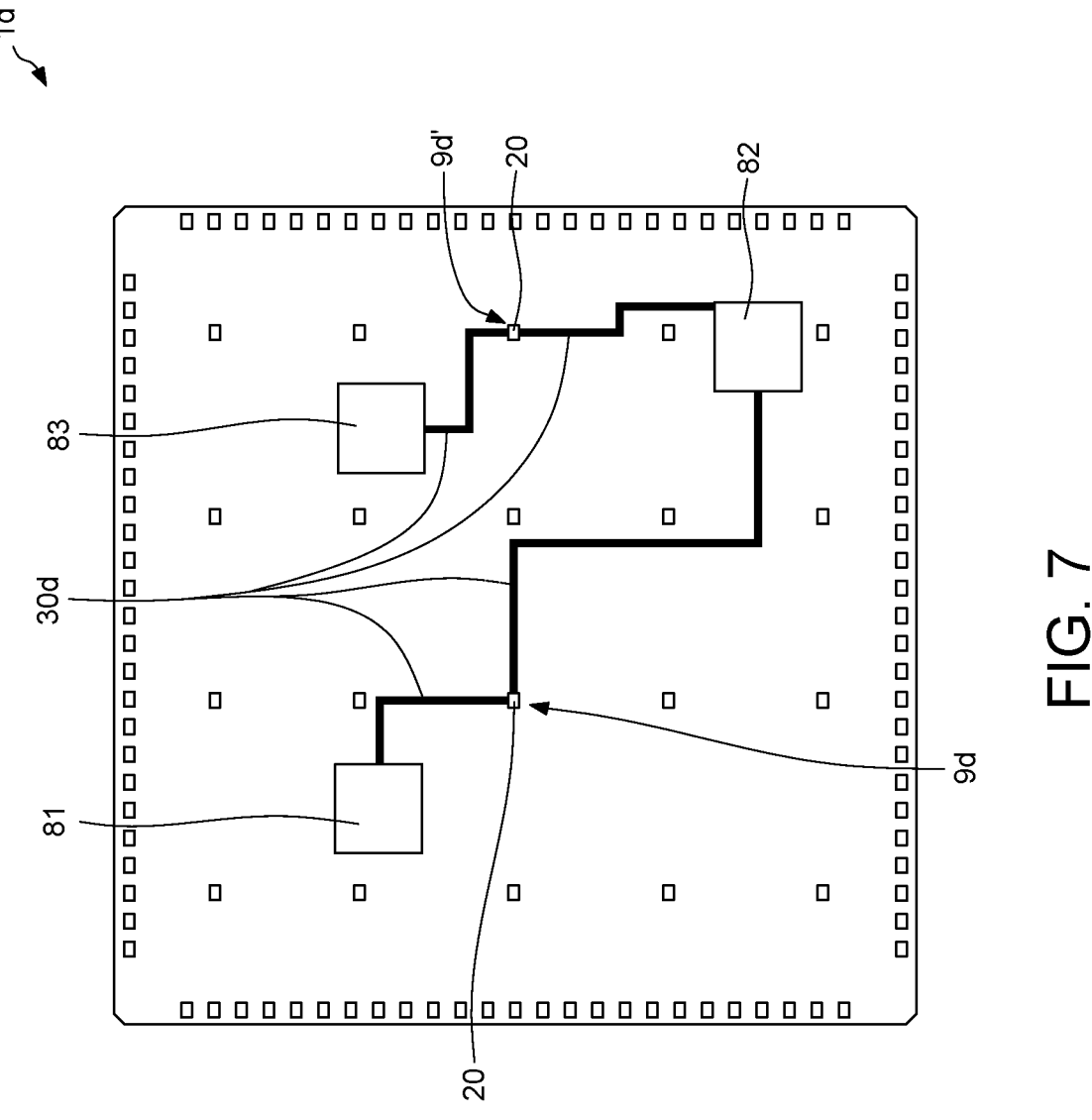
FIG. 7 illustrates a schematic layout of an upper portion of an electronic device according to some embodiments of the present disclosure.
Figure 8:
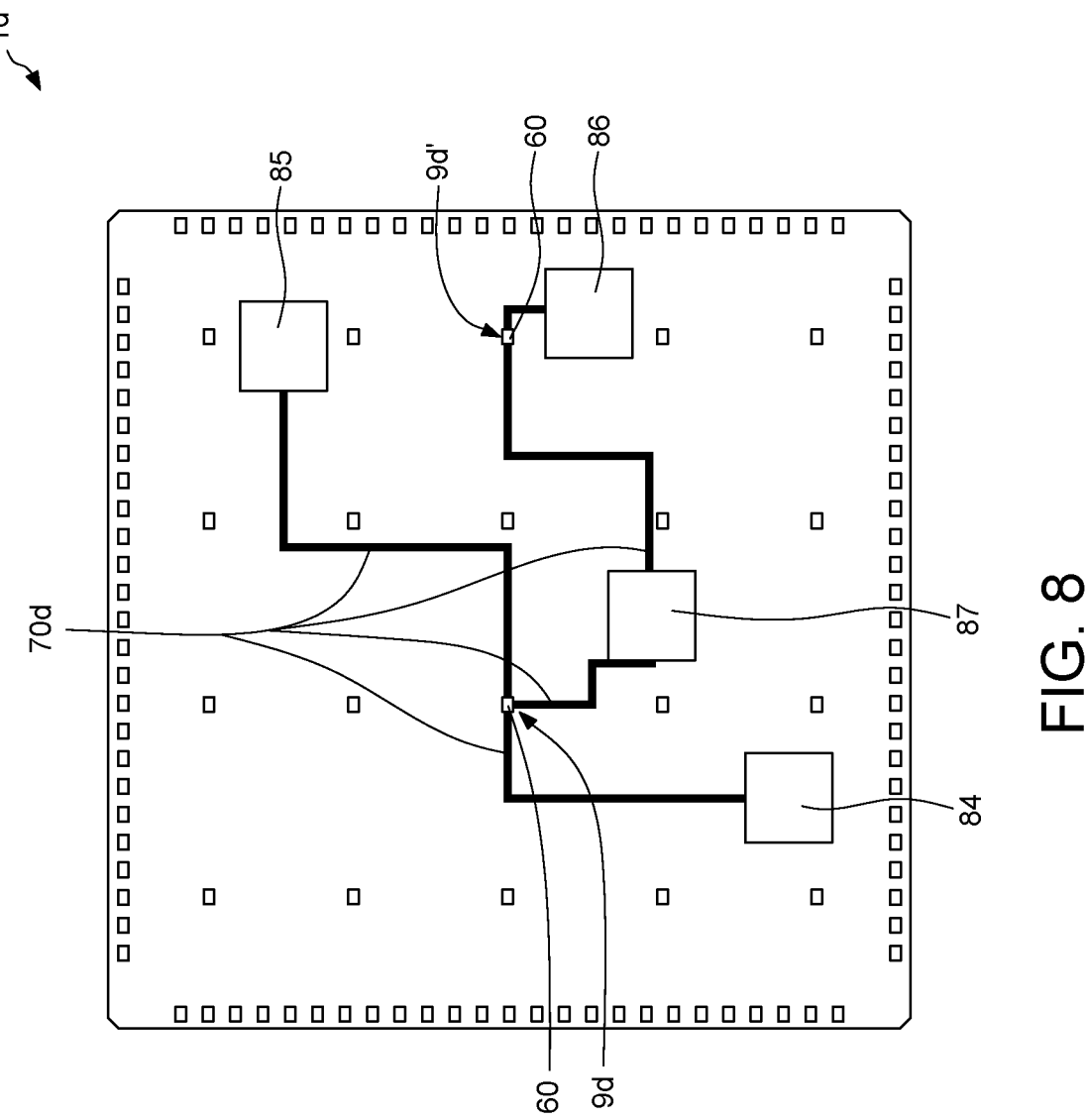
FIG. 8 illustrates a schematic layout of a lower portion of an electronic device of FIG. 7.

FIG. 7 illustrates a schematic layout of an upper portion of an electronic device 1d according to some embodiments of the present disclosure. FIG. 8 illustrates a schematic layout of a lower portion of an electronic device of FIG. 7. The electronic device 1d of FIG. 7 and FIG. 8 is similar to the electronic device 1c of FIG. 5 and FIG. 6, except that the electronic device 1d further includes an upper electronic structure 83, a lower electronic structure 86 and a lower electronic structure 87. As shown in FIG. 7, the upper electronic structure 83 is electrically connected to the upper connection portion 20 of the other shared connection structure 9d through the first metal layer 30d. In some embodiments, the upper electronic structure 83 can be, for example, static random access memory (SRAM) device. In some embodiments, as shown in FIG. 7, the upper electronic structure 82 can also be electrically connected to the upper connection portion 20 of the shared connection structure 9d' through the first metal layer 30d. As shown in FIG. 8, the lower electronic structure 86 is electrically connected to the lower connection portion 60 of the shared connection structure 9d' through the second metal layer 70d. In some embodiments, the lower electronic structure 86 can be, for example, medium-voltage device. The lower electronic structure 87 is electrically connected to the lower connection portion 60 of the shared connection structure 9d and the lower connection portion 60 of the shared connection structure 9d' through the second metal layer 70d. In some embodiments, the lower electronic structure 87 can be, for example, resistor.

As shown in the embodiment illustrated in FIG. 7 and FIG. 8, the upper electronic structure 81 (e.g., the SRAM device), the upper electronic structure 83 (e.g., the SRAM device), the lower electronic structure 84 (e.g., the medium-voltage device), the lower electronic structure 85 (e.g., the BJT device) and the lower electronic structure 86 (e.g., the medium-voltage device) can share the same upper electronic structure 82 (e.g., the diode) and the same lower electronic structure 87 (e.g., the resistor), thus saving the design area.

Figure 9:
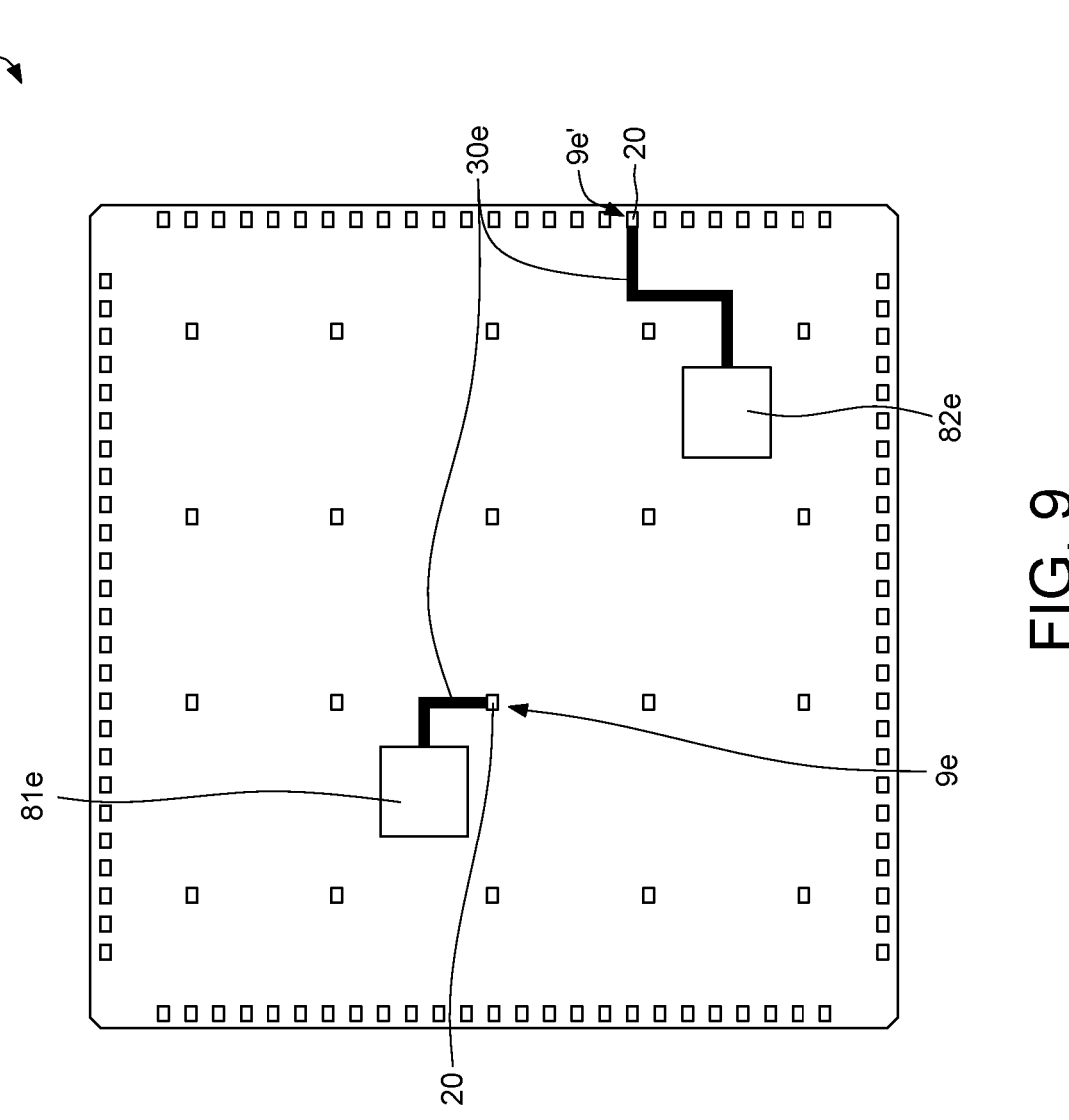
FIG. 9 illustrates a schematic layout of an upper portion of an electronic device according to some embodiments of the present disclosure.
Figure 10:
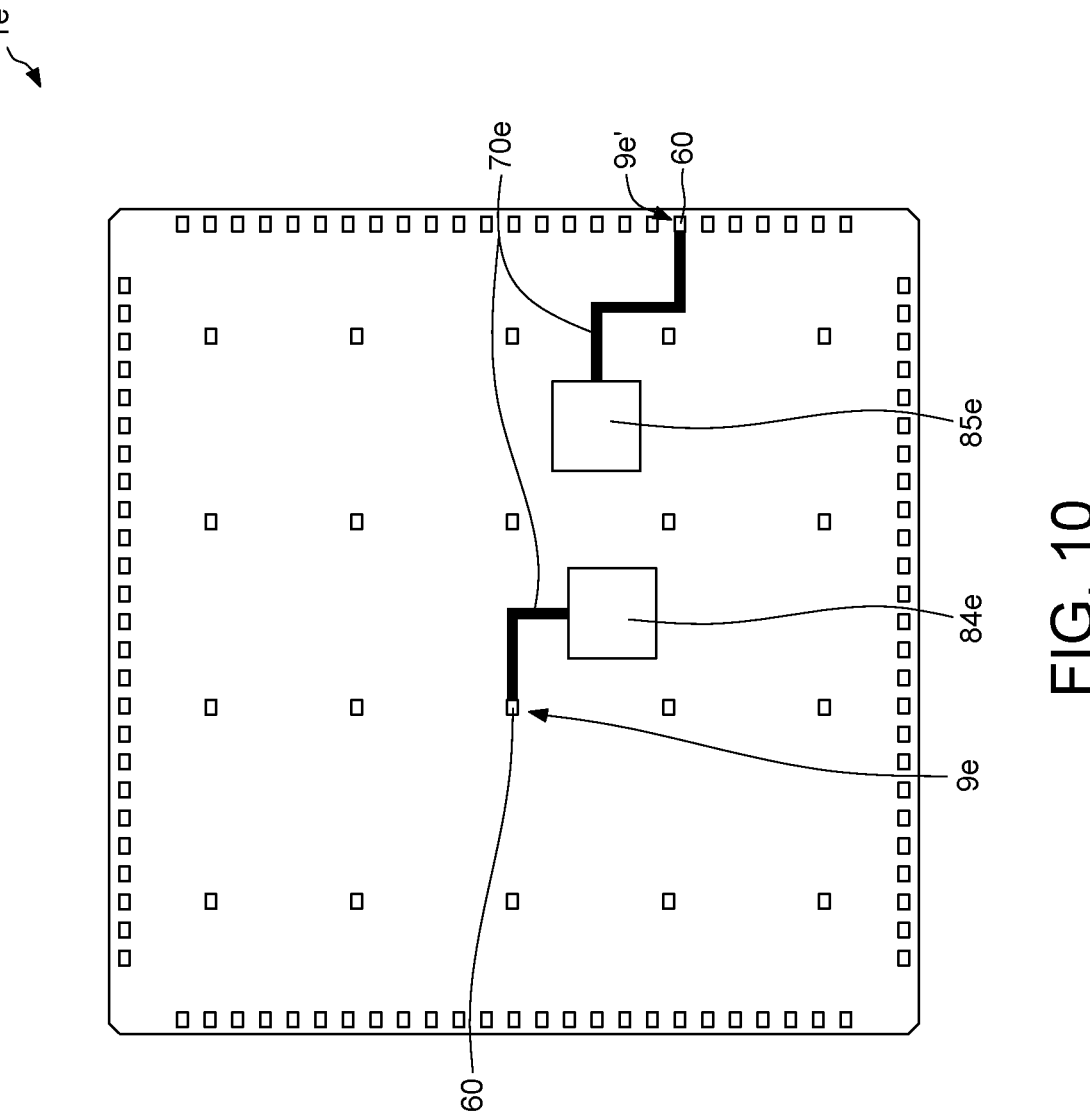
FIG. 10 illustrates a schematic layout of a lower portion of an electronic device of FIG. 9.

FIG. 9 illustrates a schematic layout of an upper portion of an electronic device 1e according to some embodiments of the present disclosure. FIG. 10 illustrates a schematic layout of a lower portion of an electronic device of FIG. 9. The electronic device 1e of FIG. 9 and FIG. 10 is similar to the electronic device 1c of FIG. 5 and FIG. 6, except for configurations of the upper electronic structure 81e, the upper electronic structure 82e, the lower electronic structure 84e and the lower electronic structure 85e. In some embodiments, as shown in FIG. 9, the upper electronic structure 81e (e.g., the SRAM device) can be electrically connected to the upper connection portion 20 of the shared connection structure 9e through the first metal layer 30e. The upper electronic structure 82e (e.g., the diode) can be electrically connected to the upper connection portion 20 of the shared connection structure 9e' through the first metal layer 30e. That is, the upper electronic structure 81e (e.g., the SRAM device) and the upper electronic structure 82e (e.g., the diode) can be electrically connected to different shared connection structures (e.g., the shared connection structure 9e and the shared connection structure 9e'). As shown in FIG. 10, the lower electronic structure 84e (e.g., the medium-voltage device) can be electrically connected to the lower connection portion 60 of the shared connection structure 9e through the second metal layer 70e. The lower electronic structure 85e (e.g., the BJT device) can be electrically connected to the lower connection portion 60 of the shared connection structure 9e' through the second metal layer 70e. That is, the lower electronic structure 84e (e.g., the medium-voltage device) and the lower electronic structure 85e (e.g., the BJT device) can be electrically connected to different shared connection structures (e.g., the shared connection structure 9e and the shared connection structure 9e').

FIG. 11 through FIG. 15 illustrate a method for manufacturing an electronic device according to some embodiments of the present disclosure. In some embodiments, the method is for manufacturing an electronic device such as the electronic device 1 shown in FIG. 1.

Figure 11:
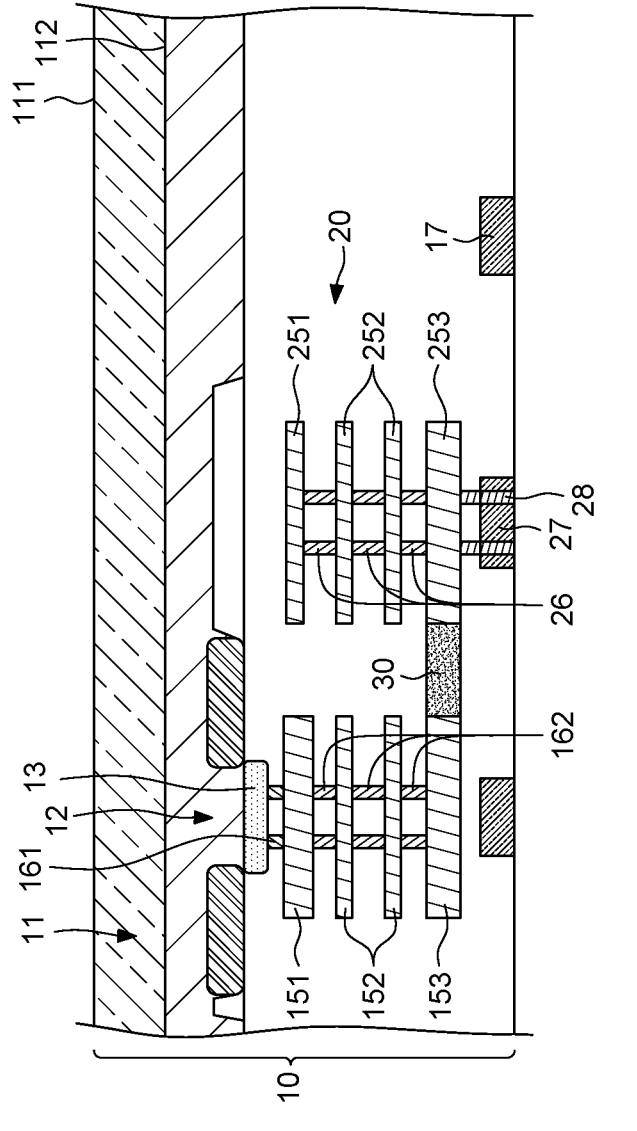
FIG. 11 illustrates a cross-sectional view of one or more stages of an example of a method for manufacturing an electronic device according to some embodiments of the present disclosure.
Figure 12:
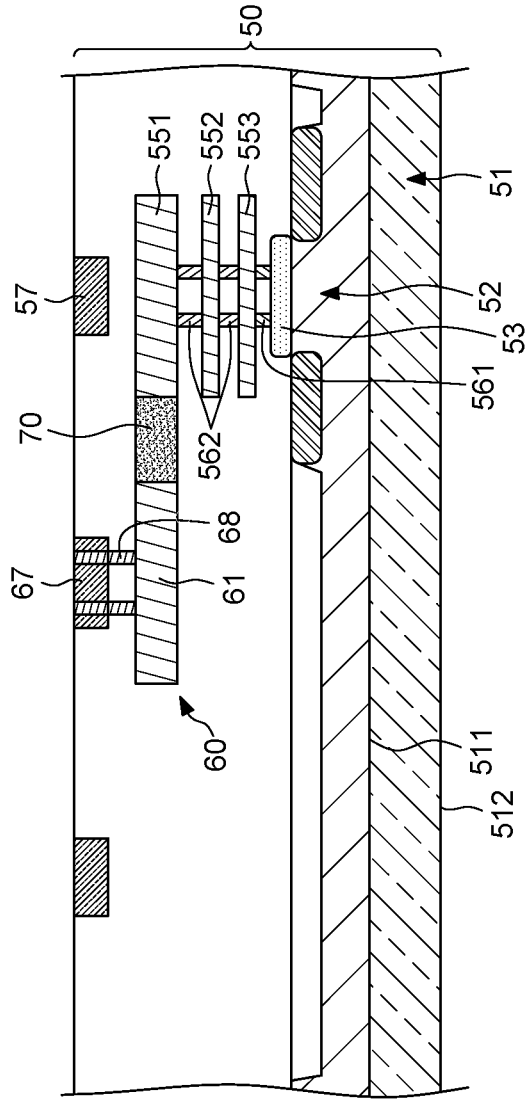
FIG. 12 illustrates a cross-sectional view of one or more stages of an example of a method for manufacturing an electronic device according to some embodiments of the present disclosure.

Referring to FIG. 11 and FIG. 12, an upper electronic structure 10, an upper connection structure 20, a lower electronic structure 50 and a lower connection structure 60 are provided. The upper electronic structure 10 of FIG. 11 can be the same as the upper electronic structure 10 of FIG. 1. The upper connection structure 20 of FIG. 11 can be the same as the upper connection structure 20 of FIG. 1. The lower electronic structure 50 of FIG. 12 can be the same as the lower electronic structure 50 of FIG. 1. The lower connection structure 60 of FIG. 12 can be the same as the lower connection structure 60 of FIG. 1.

Referring to FIG. 11 and FIG. 12 again, the upper electronic structure 10 is electrically connected to the upper connection structure 20 through a first metal layer 30 (FIG. 11), and the lower electronic structure 50 is electrically connected to the lower connection structure 60 through a second metal layer 70 (FIG. 12). The first metal layer 30 of FIG. 11 can be the same as the first metal layer 30 of FIG. 1. The second metal layer 70 of FIG. 12 can be the same as the second metal layer 70 of FIG. 1. Thus, as shown in FIG. 11, a bottommost circuit layer 153 of the upper electronic structure 10 can be electrically connected to a bottommost circuit layer 253 of the upper connection structure 20 through the first metal layer 30. As shown in FIG. 12, a topmost circuit layer 551 of the lower electronic structure 50 can be electrically connected to the at least one circuit layer 61 of the lower connection structure 60 through the second metal layer 70.

In some embodiments, as shown in FIG. 11, the first metal layer 30 and the bottommost circuit layer 253 of the upper connection structure 20 can be formed at different times or different stages. For example, the first metal layer 30 can be formed after the formation of the bottommost circuit layer 253 of the upper connection structure 20. The first metal layer 30 and the bottommost circuit layer 153 of the upper electronic structure 10 can also be formed at different times or different stages. For example, the first metal layer 30 can be formed after the formation of the bottommost circuit layer 153 of the upper electronic structure 10. In some embodiments, the first metal layer 30, the bottommost circuit layer 253 of the upper connection structure 20 and the bottommost circuit layer 153 of the upper electronic structure 10 can be formed concurrently.

In some embodiments, as shown in FIG. 12, the second metal layer 70 and the at least one circuit layer 61 of the lower connection structure 60 can be formed at different times or different stages. For example, the second metal layer 70 can be formed after the formation of the at least one circuit layer 61 of the lower connection structure 60. The second metal layer 70 and the topmost circuit layer 551 of the lower electronic structure 50 can also be formed at different times or different stages. For example, the second metal layer 70 can be formed after the formation of the topmost circuit layer 551 of the lower electronic structure 50. In some embodiments, the second metal layer 70, the at least one circuit layer 61 of the lower connection structure 60 and the topmost circuit layer 551 of the lower electronic structure 50 can be formed concurrently.

Figure 13:
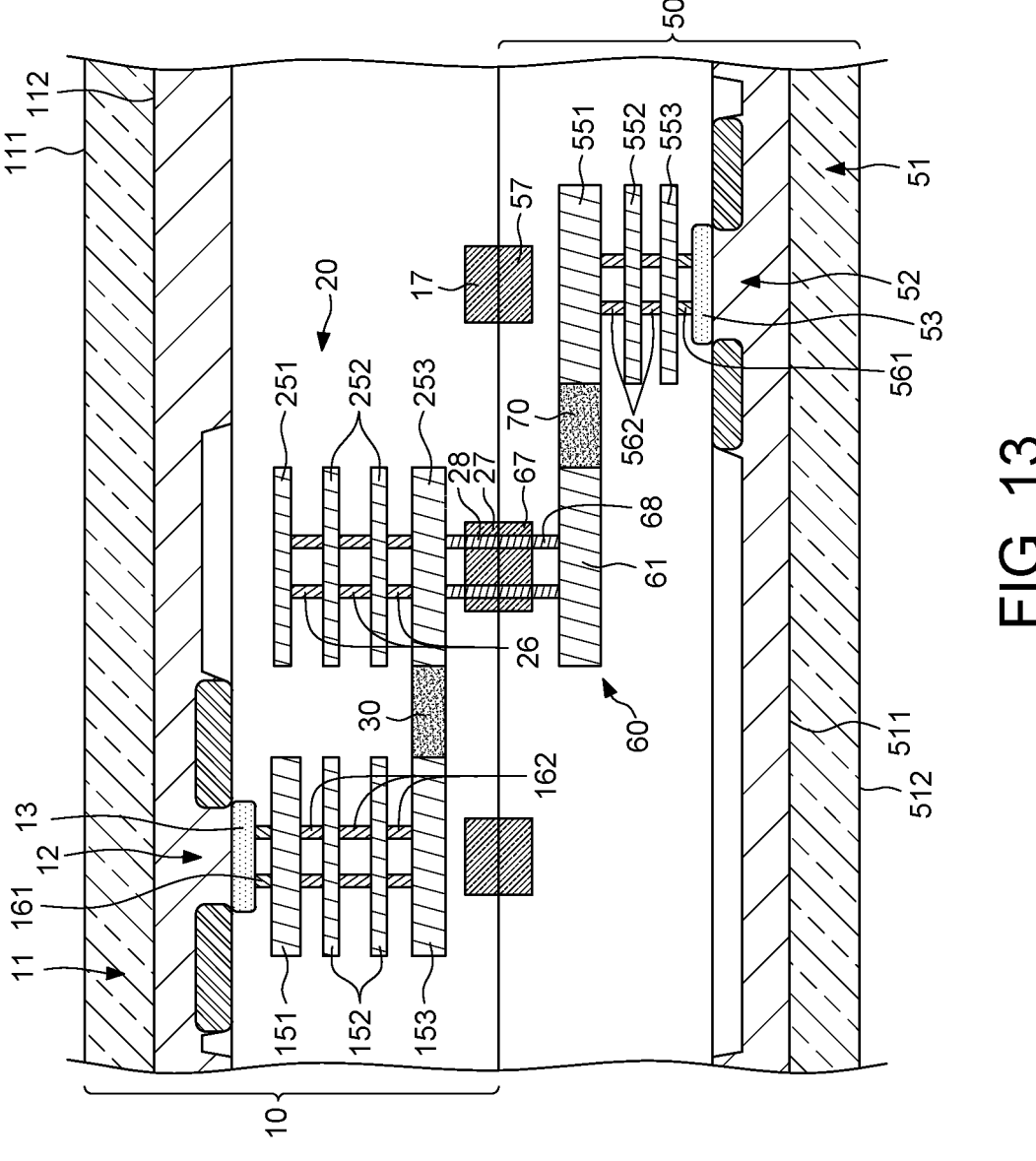
FIG. 13 illustrates a cross-sectional view of one or more stages of an example of a method for manufacturing an electronic device according to some embodiments of the present disclosure.

Referring to FIG. 13, the upper connection structure 20 and the lower connection structure 60 are bonded together by, for example, hybrid bonding. Thus, the upper electronic structure 10 can be electrically connected to the lower electronic structure 50 through the upper connection structure 20. Accordingly, the lower electronic structure 50 can be electrically connected to the upper electronic structure 10 through the lower connection structure 60.

Figure 14:
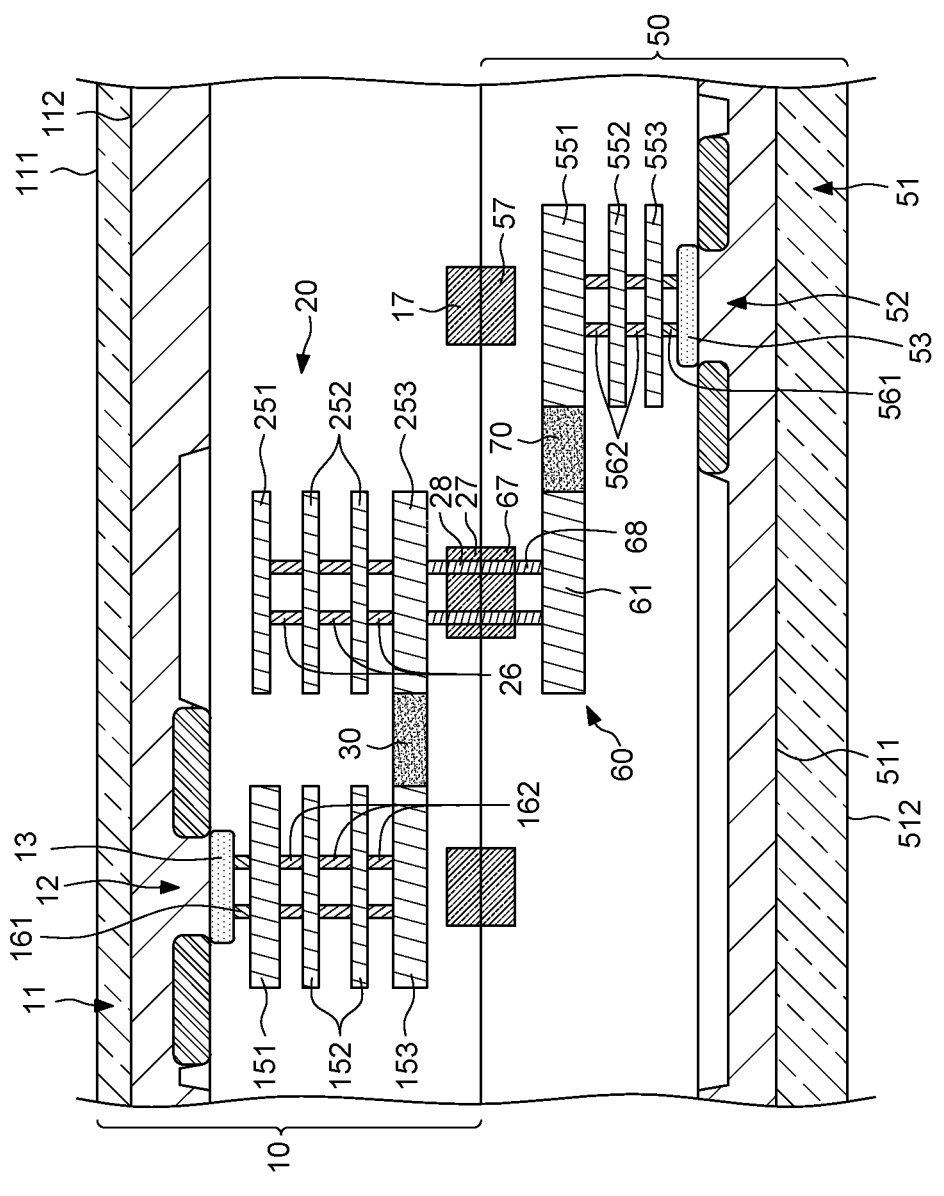
FIG. 14 illustrates a cross-sectional view of one or more stages of an example of a method for manufacturing an electronic device according to some embodiments of the present disclosure.

Referring to FIG. 14, the substrate 11 of the upper connection structure 20 is thinned by, for example, grinding.

Figure 15:
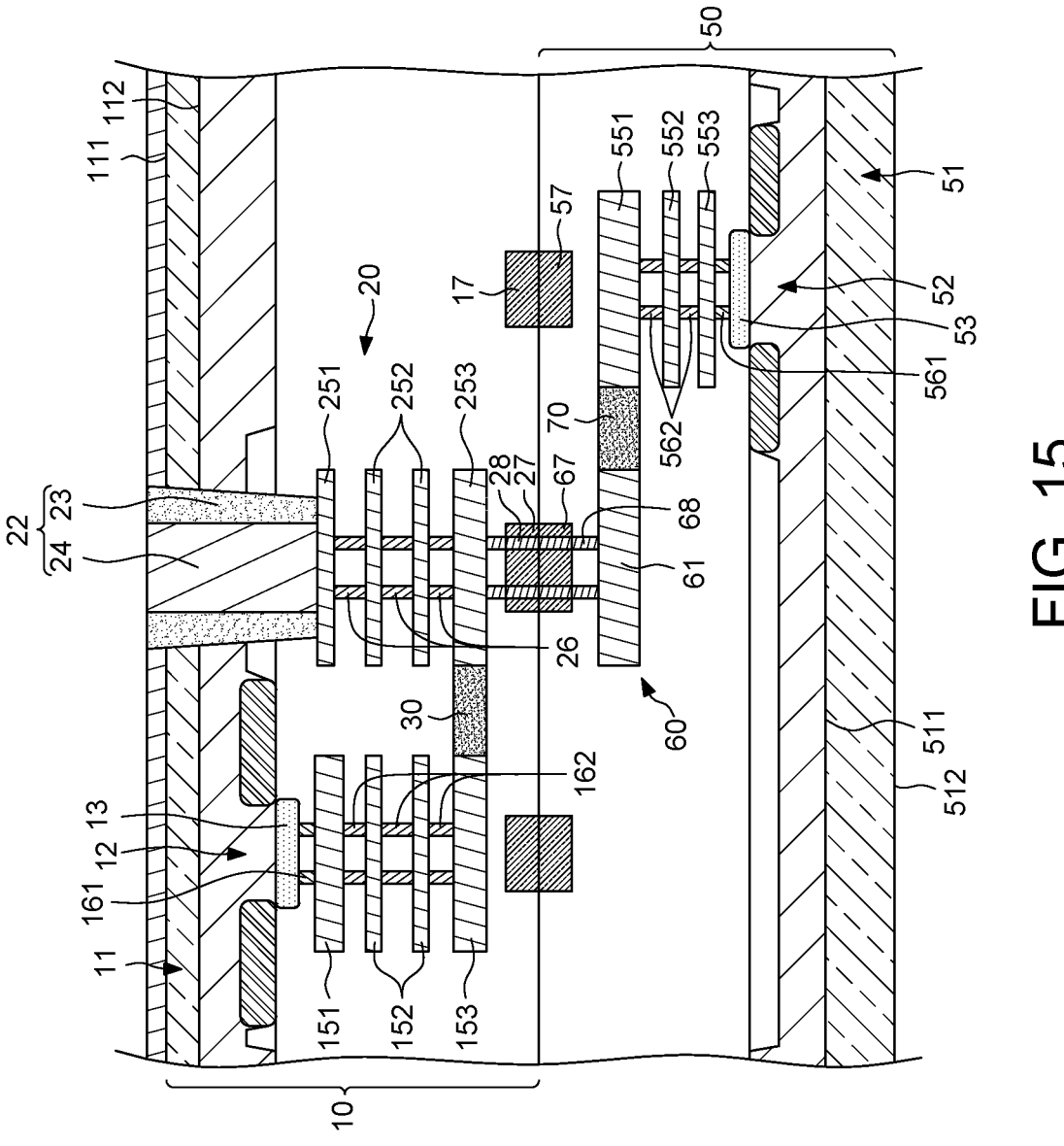
FIG. 15 illustrates a cross-sectional view of one or more stages of an example of a method for manufacturing an electronic device according to some embodiments of the present disclosure.

Referring to FIG. 15, a via structure 22 is formed extending through the substrate 11 and the well structure 12 of the upper electronic structure 10 and on the topmost circuit layer 251. The via structure 22 of FIG. 15 can be the same as the via structure 22 of FIG. 1.

Then, a redistribution layer 21 is formed on the via structure 22 to obtain the electronic device 1 of FIG. 1.

The method of the present disclosure can be applied in wafer-on-wafer (WoW) bonding processes; however, the disclosure is not limited thereto. As shown in the embodiments illustrated in FIG. 1 and FIG. 11 through FIG. 15, the interconnection between the upper electronic structure 10 and the lower electronic structure 50 can be realized through the at least one shared connection structure 9 (including, for example, the upper connection portion 20 and the lower connection portion 60). Thus, face-to-face interconnection is not required, reducing design changes' difficulties.

Figure 16:
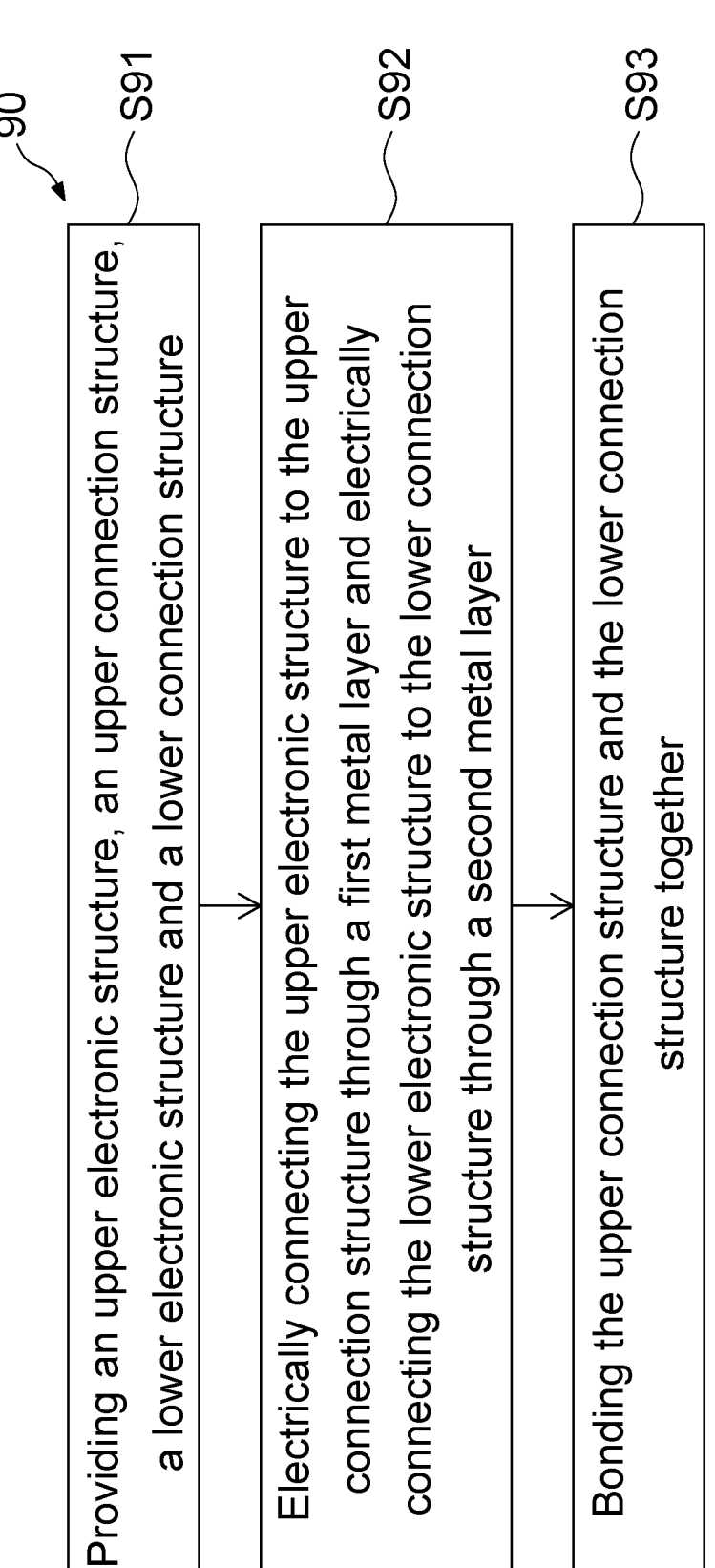
FIG. 16 illustrates a flowchart of a method for manufacturing an electronic device according to some embodiments of the present disclosure.

FIG. 16 illustrates a flowchart of a method 90 for manufacturing an electronic device according to some embodiments of the present disclosure.

In some embodiments, the method 90 can include a step S91, providing an upper electronic structure, an upper connection structure, a lower electronic structure and a lower connection structure. For example, as shown in FIG. 11 and FIG. 12, the upper electronic structure 10, the upper connection structure 20, the lower electronic structure 50 and the lower connection structure 60 are provided.

In some embodiments, the method 90 can include a step S92, electrically connecting the upper electronic structure to the upper connection structure through a first metal layer and electrically connecting the lower electronic structure to the lower connection structure through a second metal layer. For example, as shown in FIG. 11 and FIG. 12, the upper electronic structure 10 is electrically connected to the upper connection structure 20 through the first metal layer 30 (FIG. 11), and the lower electronic structure 50 is electrically connected to the lower connection structure 60 through the second metal layer 70 (FIG. 12).

In some embodiments, the method 90 can include a step S93, bonding the upper connection structure and the lower connection structure together. For example, as shown in FIG. 13, the upper connection structure 20 and the lower connection structure 60 are bonded together.

In accordance with some embodiments of the present disclosure, an electronic device includes an upper electronic structure, an upper connection structure, a first metal layer, a lower electronic structure, a lower connection structure and a second metal layer. The first metal layer electrically connects the upper electronic structure to the upper connection structure. The second metal layer electrically connects the lower electronic structure to the lower connection structure. The upper connection structure and the lower connection structure are bonded together.

In accordance with some embodiments of the present disclosure, an electronic device includes at least one shared connection structure, at least one upper electronic structure and at least one lower electronic structure. The at least one shared connection structure includes an upper connection portion and a lower connection portion bonded to the upper connection portion. The at least one upper electronic structure is electrically connected to the upper connection portion of the at least one shared connection structure. The at least one lower electronic structure is electrically connected to the lower connection portion of the at least one shared connection structure.

In accordance with some embodiments of the present disclosure, a method for manufacturing an electronic device includes: providing an upper electronic structure, an upper connection structure, a lower electronic structure and a lower connection structure; electrically connecting the upper electronic structure to the upper connection structure through a first metal layer and electrically connecting the lower electronic structure to the lower connection structure through a second metal layer; and bonding the upper connection structure and the lower connection structure together.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An electronic device, comprising:
an upper device layer comprising:
a first semiconductor substrate;
first semiconductor devices disposed on the first semiconductor substrate;
a first back-end-of-line (BEOL) metal interconnect structure disposed on the first semiconductor substrate, wherein the first BEOL metal interconnect structure comprises a plurality of metallization layers interleaved with a plurality of via layers;
through silicon vias (TSVs) extending through the first semiconductor substrate and electrically connected to the first BEOL metal interconnect structure;
a first bonding layer on the first BEOL metal interconnect structure, wherein the first bonding layer comprises first bond pads electrically connected to the TSVs by first connection structures, wherein the first connection structures are part of the first BEOL metal interconnect structure;
a lower device layer comprising:
a second semiconductor substrate;
second semiconductor devices disposed on the second semiconductor substrate;
a second BEOL metal interconnect structure disposed on the second semiconductor substrate, wherein the second BEOL metal interconnect structure comprises a plurality of metallization layers interleaved with a plurality of via layers; and
a second bonding layer on the second BEOL metal interconnect structure, wherein the second bonding layer comprises second bond pads bonded to the first bond pads and electrically connected to the second BEOL metal interconnect structure;
wherein at least one of the first semiconductor devices is electrically connected to at least one of the second semiconductor devices;
all of the first semiconductor devices that are electrically connected to second semiconductor devices are coupled through connections between the first bond pads and the second bond pads;
the first semiconductor devices are in a first area of the upper device layer, and the TSVs comprise a grid of TSVs extending across the first area; and
the TSVs further comprise TSVs in a row along an edge of the first area, wherein the TSVs in the row along the edge are more closely spaced than the TSVs in the grid.

2. The electronic device of claim 1, wherein each of the TSVs in the grid is electrically connected to at least one of the second bond pads.

3. The electronic device of claim 1, wherein the second bond pads comprise a grid of bond pads corresponding to the grid of TSVs.

4. The electronic device of claim 3, wherein the second bond pads in the grid of bond pads are electrically connected to metal structures that are parts of the second BEOL metal interconnect structure.

5. The electronic device of claim 1, wherein:
the second BEOL metal interconnect structure comprises
  a top metallization layer, which is the metallization layer furthest from the second semiconductor substrate; and
the top metallization layer includes a connection plate for each of the second bond pads, wherein the connection plates are directly beneath and electrically connected to the corresponding second bond pads.

6. The electronic device of claim 5, wherein one of the connection plates has no electrical connections other than to the corresponding second bond pad.

7. The electronic device of claim 5, wherein one of the connection plates is part of a metal structure that floats within the second BEOL metal interconnect structure except for being electrically connected to the corresponding second bond pad.

8. The electronic device of claim 5, wherein;
one of the connections plates is laterally offset from the second semiconductor device; and the first and second semiconductor device are electrically connected through the connections plate that is laterally offset from the second semiconductor device.

9. The electronic device of claim 1, wherein;
the first connection structures are disposed in the first areas of the upper device layer; and
the first connection structures, and lateral connections to the first connection structures, are the only parts of the first BEOL metal interconnect structure disposed in the first areas.

10. An electronic device, comprising:
an upper device layer comprising:
  a first semiconductor substrate;
  a first back-end-of-line (BEOL) metal interconnect structure disposed on the first semiconductor substrate, wherein the first BEOL metal interconnect structure comprises a plurality of metallization layers interleaved with a plurality of via layers;
  through silicon vias (TSVs) extending through the first semiconductor substrate and electrically connected to the first BEOL metal interconnect structure;
  a first bonding layer on the first BEOL metal interconnect structure, wherein the first bonding layer comprises first bond pads electrically connected to the TSVs by first TSV connection structures which are part of the first BEOL metal interconnect structure;
  first semiconductor devices disposed on the first semiconductor substrate, wherein the first semiconductor devices have terminals electrically connected to first device connection structures which are part of the first BEOL metal interconnect structure; and
  first metal connectors that electrically connect the first device connection structures to the first TSV connection structures by making lateral connections between wires in one of the metallization layers in the first BEOL metal interconnect structure; and a lower device layer comprising:
  a second semiconductor substrate;
  a second BEOL metal interconnect structure disposed on the second semiconductor substrate, wherein the second BEOL metal interconnect structure comprises a plurality of metallization layers interleaved with a plurality of via layers;
  a second bonding layer on the second BEOL metal interconnect structure, wherein the second bonding layer comprises second bond pads bonded to the first bond pads and electrically connected to second TSV connection structures which are part of the second BEOL metal interconnect structure;
  second semiconductor devices disposed on the second semiconductor substrate, wherein the second semiconductor devices have terminals electrically connected to second device connection structures which are part of the second BEOL metal interconnect structure; and
  second metal connectors that electrically connect the second device connection structures to the second TSV connection structures by making lateral connections between wires in one of the metallization layers in the second BEOL metal interconnect structure;
wherein at least one of the first metal connectors or the second metal connectors is distinguished from the wires in the corresponding metallization layer by a difference that establishes the connector was formed separately from the wires in the corresponding metallization layer, wherein the difference is a difference in thickness, composition, or elevation.

11. The electronic device of claim 10, wherein both the first and second metal connectors have a difference in elevation, thickness, composition or other feature that establishes they were formed at a separate time from the metallization layer in which they are contained.

12. The electronic device of claim 10, wherein the first TSV connection structures are disposed in first areas, the first device connection structures are disposed in second areas, and the first and second areas are non-overlapping areas of the first device layer.

13. The electronic device of claim 10, wherein the second TSV connection structures are disposed in first areas, the second device connection structures are disposed in second areas, and the first and second areas are non-overlapping areas of the second device layer.

14. A method, comprising:
providing a first device layer comprising:
  a first semiconductor substrate;
  a first back-end-of-line (BEOL) metal interconnect structure disposed on the first semiconductor substrate, wherein the first BEOL metal interconnect structure comprises a plurality of metallization layers interleaved with a plurality of via layers;
  through silicon vias (TSVs) extending through the first semiconductor substrate and electrically connected to the first BEOL metal interconnect structure;
  a first bonding layer on the first BEOL metal interconnect structure, wherein the first bonding layer comprises first bond pads electrically connected to the TSVs by first TSV connection structures which are part of the first BEOL metal interconnect structure; and
  first semiconductor devices disposed on the first semiconductor substrate, wherein the first semiconductor devices have terminals electrically connected to first device connection structures which are part of the first BEOL metal interconnect structure;

providing a second device layer comprising:

a second semiconductor substrate;

a second BEOL metal interconnect structure disposed on the second semiconductor substrate, wherein the second BEOL metal interconnect structure comprises a plurality of metallization layers interleaved with a plurality of via layers;

a second bonding layer on the second BEOL metal interconnect structure, wherein the second bonding layer comprises second bond pads bonded to the first bond pads and electrically connected to second TSV connection structures which are part of the second BEOL metal interconnect structure;

second semiconductor devices disposed on the second semiconductor substrate, wherein each of the second semiconductor devices has a terminal electrically connected to a corresponding second device connection structure which is part of the second BEOL metal interconnect structure;

forming first metal connectors electrically connecting one of the first device connection structures to one of the first TSV connection structures, wherein the first metal connectors are disposed within one of the metallization layers in the first BEOL metal interconnect structure; and forming second metal connectors electrically connecting one of the second device connection structures to one of the second TSV connection structures at an elevation of one of the metallization layers in the second BEOL metal interconnect structure, wherein either the first metal connectors are formed after the first BEOL metal interconnect structure or the second metal connectors are formed after the second BEOL metal interconnect structure; and bonding the first device layer to the second device layer through the first and second bonding layers, wherein the first bond pads are bonded to the second bond pads.

15. The method of claim 14, wherein either the first metal connectors are formed after the first BEOL metal interconnect structure or the second metal connectors are formed after the second BEOL metal interconnect structure.

16. The method of claim 14, further comprising designing the first and second BEOL metal interconnect structures independently except for a layout of the first and second TSV connection structures.

17. The method of claim 14, wherein two or more of the first metal connectors are electrically connected to one of the first TSV connection structures.

18. The method of claim 14, wherein two or more of the second metal connectors are electrically connected to one of the second TSV connection structures.

19. The electronic device of claim 10, wherein one of the first semiconductor devices is connected to one of the second semiconductor devices through one of the first metal connectors and one of the second metal connectors.

20. The electronic device of claim 19, wherein all the first semiconductor devices that are connected to second semiconductor devices are connected through the first metal connectors and the second metal connectors.

* * * * *